United States Patent

Rose et al.

[11] Patent Number: 5,178,976
[45] Date of Patent: Jan. 12, 1993

[54] TECHNIQUE FOR PREPARING A PHOTO-MASK FOR IMAGING THREE-DIMENSIONAL OBJECTS

[75] Inventors: James W. Rose, Delmar; Bradley R. Karas, Amsterdam, both of N.Y.; Lubomry S. Onyshkevych, Lawrenceville, N.J.

[73] Assignee: General Electric Company, Schenectady, N.Y.

[21] Appl. No.: 580,058

[22] Filed: Sep. 10, 1990

[51] Int. Cl.⁵ .............................. G03F 1/00
[52] U.S. Cl. ........................ 430/5; 430/322; 430/318; 264/247; 264/220
[58] Field of Search ............. 427/99, 96, 100; 430/5, 430/322, 318; 156/247, 232, 307.7, 196; 254/247, 220

[56] References Cited

U.S. PATENT DOCUMENTS

| | | | |
|---|---|---|---|
| 2,874,085 | 2/1959 | Brietzke | 156/233 |
| 3,181,986 | 5/1965 | Pritikin | 156/233 |
| 3,728,177 | 4/1973 | Caule | 430/318 |
| 3,953,658 | 4/1976 | Brandt et al. | 422/124 |
| 3,991,321 | 11/1976 | Khanna | 427/100 |
| 4,059,467 | 11/1977 | Mancke et al. | 156/247 |
| 4,081,653 | 5/1978 | Koo et al. | 427/96 |
| 4,282,314 | 8/1981 | Dinella et al. | 430/5 |
| 4,288,530 | 9/1981 | Bedaral et al. | 427/96 |
| 4,414,317 | 11/1980 | Culp et al. | 430/4 |
| 4,617,078 | 10/1986 | Takahashi et al. | 156/307.5 |
| 4,710,334 | 12/1988 | Rossetti | 264/220 |
| 4,735,890 | 4/1988 | Nakane | 430/322 |
| 4,847,139 | 7/1989 | Wolf et al. | 427/96 |
| 4,969,257 | 11/1990 | Sato et al. | 427/96 |
| 4,985,116 | 1/1991 | Mettler et al. | 430/5 |
| 5,039,735 | 8/1991 | Arai et al. | 528/17 |

FOREIGN PATENT DOCUMENTS

| | | | |
|---|---|---|---|
| 58-56333 | 4/1983 | Japan | 430/5 |
| 59-40644 | 3/1984 | Japan | 480/5 |
| 60-86545 | 5/1985 | Japan | 430/5 |
| 63-216335 | 9/1988 | Japan | 430/5 |

Primary Examiner—Charles L. Bowers, Jr.
Assistant Examiner—Martin Angobranndt
Attorney, Agent, or Firm—William H. Pittman

[57] ABSTRACT

A method for the preparation a photo-mask used for photo-imaging selected areas on the surfaces of a three-dimensional printed circuit board substrate. The photo-mask comprises an opaque layer, opaque and degradation resistant to UV light, having at least one side with a contoured shape conforming to the surface irregularities on the surfaces of the three-dimensional substrate being photo-imaged. A membrane transparent and degradation resistant to UV light, having at least one side cemented to the side of the opaque layer not in contact with the surfaces of the three-dimensional substrate being photo-imaged. A pattern of grooves positioned on the opaque layer allow transmission of UV light during the photo-imaging of the surfaces of the three-dimensiional substrate. The pattern of grooves is in accordance with a conductive metal trace pattern desired on the surfaces of the three-dimensional printed circuit board substrate. The photo-mask is prepared by first forming an opaque material layer on the surfaces of the three-dimensional substrate, followed by a membrane material to form the membrane. The pattern of grooves is created by ablating the opaque layer in selected areas by means of a laser beam from a laser moved in a boustrophedonous manner.

8 Claims, 11 Drawing Sheets

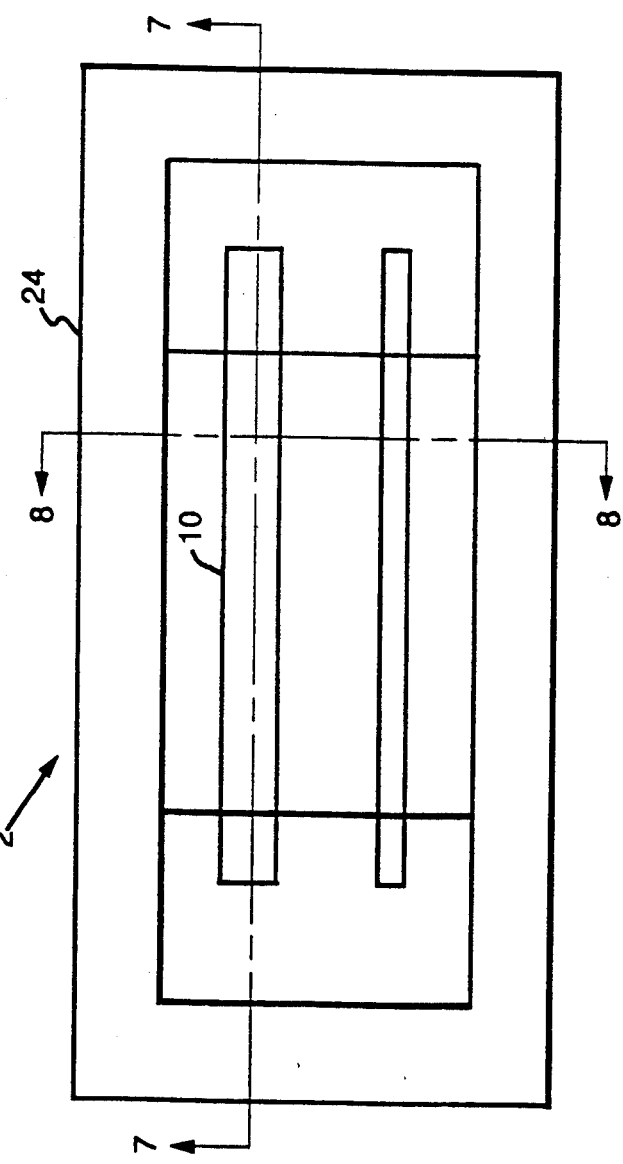

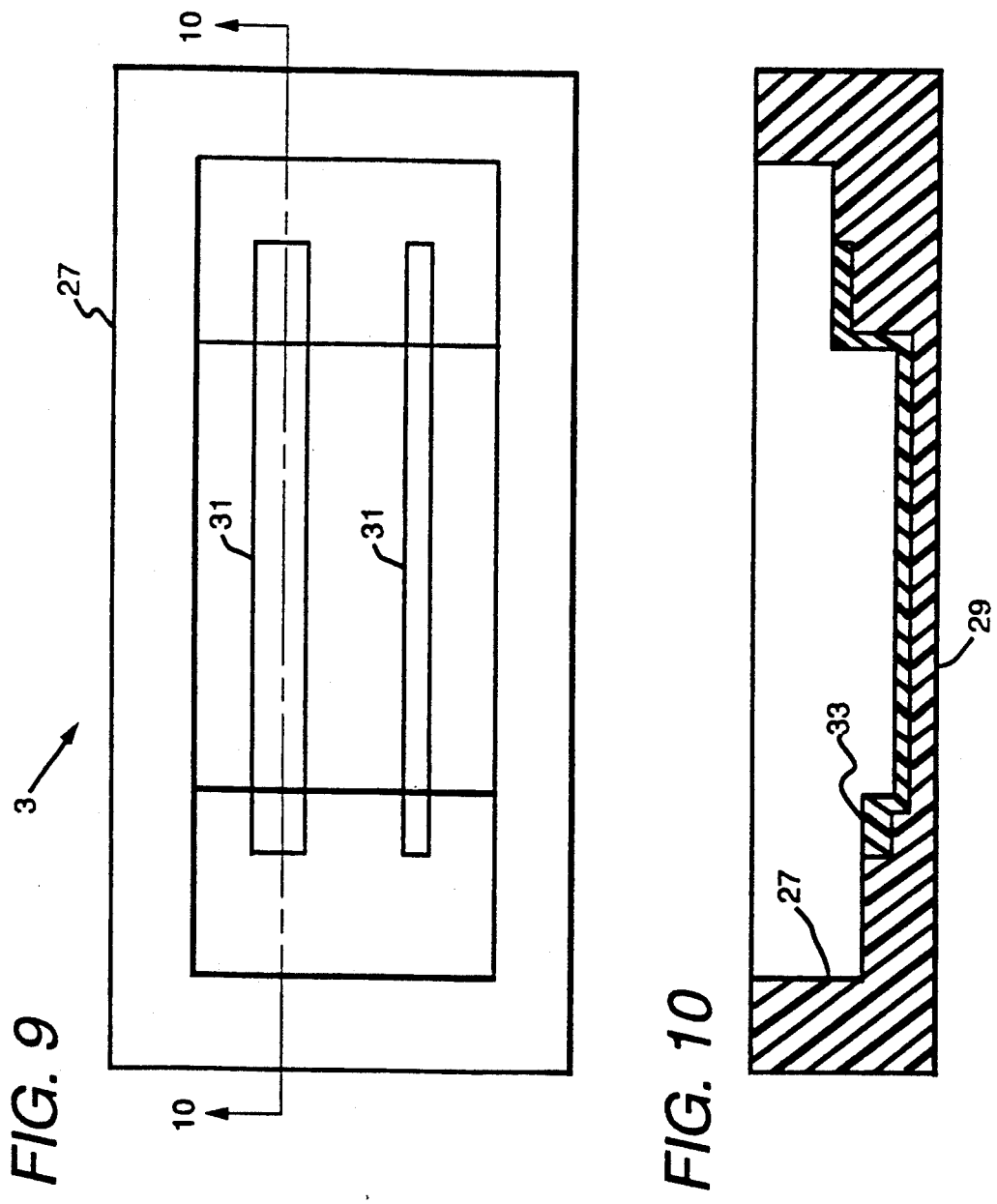

TECHNIQUE FOR PREPARING A PHOTO-MASK FOR IMAGING THREE-DIMENSIONAL OBJECTS

CROSS REFERENCE TO RELATED APPLICATIONS

Reference is made to concurrently filed application Ser. No. 07/580,056, now abandoned, for a Photo-Mask For Imaging Three-Dimensional Objects, Ser. No. 07/580,054, now U.S. Pat. No. 5,036,024, A Process For Preparing A Photo-Mask For Imaging Three-Dimensional Objects, and Ser. No. 07/580,057, now U.S. Pat. No. 5,141,829, A Method Of Preparing A Photo-Mask For Imaging Three-Dimensional Objects, which are assigned to the same assignee as the present invention and are incorporated herein by reference.

BACKGROUND OF THE INVENTION

The present invention is directed to a photo-mask used for imaging or photo-patterning three-dimensional objects such as a three-dimensional circuit board.

In recent years the concept of using three-dimensional injection molded plastic substrates for three-dimensional circuit boards has gained wide acceptance. The development of high temperature thermoplastic resins such as General Electric Company's Ultem ® polyetherimide has further enhanced the importance of the three-dimensional circuit boards. Their advantages are obvious as such types of circuit boards provide immense design flexibility. Features such as standoffs, stiffeners, bosses, connectors, and internal snaps to hold items such as batteries, can be easily incorporated into these substrates. This design flexibility in the construction of the three-dimensional substrates can result in simplified assembly operations and installation of secondary component hardware. Besides the mechanical or functional aspects of the injection molded three-dimensional substrate, the majority of base resins utilized for molded packages feature electrical, mechanical or environmental properties superior to the conventional laminates used presently in the printed circuit board industry. In fact, as compared to more premium resins, such as polyimide, triazine or Teflon ®, thermoplastic injection molded grade resins are more cost effective. The applications based on the aformentioned manufacturing technology are not limited to just printed circuit boards. For instance, injection molded three-dimensional substrates have considerable applications in the designs of discrete components as well as electromechanical or electro-optical devices. In fact, the ability of the three-dimensional circuit boards to eliminate stamped or formed metal contacts, wires and cable has wide market utility in all sorts of electrical devices on non-electronic products. However, a major drawback of the three-dimensional substrates is that a key fabrication step involved in the manufacture of circuit boards namely photo-patterning or photo-imaging of the three-dimensional substrates, has not been solved satisfactorily. When a substrate is sufficiently flat, the desired photo-pattern exposure can be effected by using a contact photo-mask for selectively blocking light projected onto the coated surface of the substrate. The photo-mask can be fabricated from Mylar ® polyester, which transmits UV (Ultraviolet) light and resists degradation by UV light. However, photo-masks made from glass plates are also used. Metal traces can be deposited in the desired occlusion pattern on the surface of the photo-mask. The Mylar ® polyester photo-mask having the desired pattern can be aligned as desired, and the alignment may be maintained using a vacuum hold-down system while UV light is selectively directed through the substrate.

Problems arise when the printed circuit board substrates are not flat. Those deviations from flatness due to, for example, features, such as "H" shaped stiffening ribs and pedestals for mounting integrated circuits, can interfere with the photo-mask placement. In addition, the smaller surface features and the imperfections such as minor surface undulations or roughness can disturb the contact between the photo-mask and the substrate. A lack of intimate contact between the photo-mask and the substrate results in light leakage under the occluded patterns on the photo-mask. As a result imaging failures such as narrower or wider than required conductive metal traces are subsequently formed on the printed circuit boards. Since in the printed circuit board industry it is not uncommon to have a photoresist layer protected by a transparent cover sheet, there is a further lack of intimate contact between the photo-mask and the substrate, thus aggravating the aforementioned light leakage defect even more.

Glass photo-masks fabricated to match the three-dimensional substrate surfaces have been tried, but with very little success due to the dimensional variability of the injection molded substrate surfaces and the difficulty of machining complex shapes on the glass photo-mask. Any discrepancy between the shape of the three-dimensional substrate and the photo-mask results in a gap where light leakage through the edges of the photo-mask occlusion pattern can occur. This light leakage in turn can cause unacceptable dispersion at the surface of the three-dimensional substrate coated with a photoresist. The problem of light leakage is further aggravated by the dimensional variations that are inherent in an injection molded three-dimensional substrate. Alternative materials which might be easier to fabricate into the desired photo-mask shapes are limited since the photo-masks must transmit, and resist degradation by the UV light.

A number of solutions such as shadow masking or projection imaging have been tried to resolve the photo-patterning of the three-dimensional substrates. The need to shape a photo-mask to avoid gross surface features such as surface roughness is obviated in shadow masking by spacing the photo-mask at a certain distance from the substrate during a collimated UV light exposure. However, it is harder to achieve accurate and high resolution exposures using the shadow masking techniques, since the position of the shadow generated by the photo-mask, depends upon the distance from the photo-mask to the substrate surface, and the angle of incidence of light relative to the substrate surface. Small errors in either of these parameters can lead to large errors in the position and the resolution of the shadow on the substrate surface. Further, the vertical surfaces on the three-dimensional substrates are difficult to image with the collimated UV light because of its inability to project the photo-mask image onto the vertical substrate surface. Moreover, the differential in incident photons on the vertical surfaces by the collimated UV light results in highly non-uniform exposures, thus further exacerbating the resolution problems. Thus, shadow masking with the collimated UV light is not considered a satisfactory alternative for manufacturing precision high circuit density, three-dimensional printed circuit boards. Methods such as pad-printing and two-step molding (insert molding of the plateable plastic traces on the non-plateable plastic substrates) are either very expensive or inflexible.

Three-dimensional photo-masks may be machined or etched out of a metal. However, these masks are expensive, difficult to make, limited as to pitch, i.e., line/space definition, very rigid and thus non-compliant, and are unable to overcome the inherent dimensional inconsistencies present in a molded three-dimensional substrate. The metal photo-masks are less effective when isolated circuits exist, and are often prone to physical distortion.

As indicated by the foregoing, so far, no truly satisfactory method for mass producing photo-patterned three-dimensional circuit board substrates has been disclosed.

Accordingly, the present invention provides a photo-mask and a method for improved photo-patterning of the three-dimensional circuit boards. More specifically, it is an object of the present invention to provide a photo-mask for photo-patterning a three-dimensional substrate having at least one side and more than one surface on which conductive metal trace patterns are deposited to form the printed circuits.

Another object of the present invention is to provide a three-dimensional photo-mask flexible enough to comply with surface irregularities on the underlying three-dimensional substrate being photo-patterned.

Another object of this invention is to provide a method for preparing the three dimensional photo-mask of the present invention.

Still another object of the present invention is to provide a method of preparing a three dimensional substrate having a conductive metal trace pattern thereon by utilizing the photo-mask of the present invention.

Other objects of the present invention, together with the features and advantages thereof will become apparent from the detailed description and when read with the accompanying drawings which illustrate exemplary embodiments of the present invention.

SUMMARY OF THE INVENTION

The present invention discloses a method of preparing a photo-mask for exposing selected areas on the surfaces of a three-dimensional substrate to light from a light source of a predetermined range of wavelength, the method comprising the steps of supplying an opaque material to form an opaque layer over said surfaces of said substrate such that said layer has a contour on at least one side conforming to said surfaces, supplying a membrane material on top of a side of said opaque layer not in contact with said surfaces, setting said membrane material into a membrane wherein said membrane adheres to said opaque layer, separating said membrane from said substrate, and producing a pattern of grooves on said opaque layer to form said photo-mask.

The pattern of grooves are produced by ablating selected portions of said opaque layer using a laser beam in accordance with a desired pattern on said surfaces of said three-dimensional substrate wherein said laser beam is directed by providing a boustrophedonous motion to a laser or said laser beam.

The photo-mask prepared from the aforementioned method is used for photo-imaging selected areas on the surfaces of a three-dimensional substrate to light from a light source of a predetermined range of wavelength. The photo-mask has a membrane having at least one side contoured to conform to the surface of the substrate being photo-imaged by a light of predetermined wavelength, typically in the ultraviolet or visible range. The membrane of the photo-mask is transparent to light from the light source being used for photo-imaging and is also resistant to degradation from said light.

The pattern on the contoured side of the photo-mask is provided by tracks opaque to the photo-imaging light. The pattern of tracks positioned along the contoured side of the membrane of the photo-mask prevents the photo-imaging (actinic) light from reaching the non-selected areas on the surface of the substrate, thereby creating the desired pattern on the substrate. The present invention contemplates a lightfield as well as a darkfield photo-mask, either one of which may be used with a positive or a negative photoresist in producing a desired conductive trace pattern on the surface of the substrate.

BRIEF DESCRIPTION OF THE DRAWINGS

FIG. 6 is a plan view of a photo-mask 2 of another embodiment of the invention.

FIG. 7 is a cross-sectional view of the embodiment of FIG. 6 taken along plane 7—7.

FIG. 8 is a cross-sectional view of the embodiment of FIG. 6 taken along plane 8—8.

FIG. 9 is a plan view of a photo-mask 3 of yet another embodiment of the invention.

FIG. 10 is a cross-sectional view of the embodiment of FIG. 9 taken along plane 10—10.

DETAILED DESCRIPTION OF THE INVENTION

Figure 3:
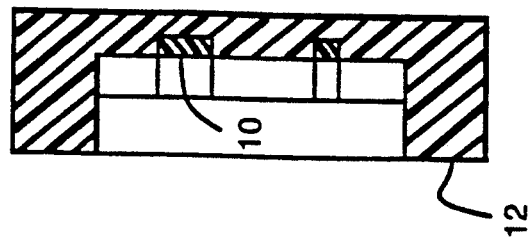
FIG. 3 is a cross-sectional view of the preferred embodiment of FIG. 1 taken along plane 3—3.

In the printed circuit board industry, a pattern of the metal conductors (conductive metal traces) on the printed circuit board (PCB) is generally selectively formed by first applying a photo-polymer layer (photoresist) onto a metal-clad substrate. Typically metals such as copper, silver, nickel, tin, lead, gold and combinations thereof are used for metal cladding. Next, a glass or a Mylar ® polyester photo-mask is juxtaposed over the photo-polymer layer. The photo-mask contains transparent and opaque regions that are in accordance with a desired metal trace pattern on the printed circuit board. The aforementioned assembly is then placed in a vacuum fixture to align and hold it firmly in place, during the photo-imaging process. The photo-polymer layer is typically exposed to a non-collimated or mildly collimated UV light having $\lambda_{cutoff}$ less than about 330 nanometers and an angle of declination greater than about 8° to 10° except for fine lines of conductive traces having 1 to 3 mil width. The UV light acts as an actinic ray to photochemically change the photopolymer layer. Following the UV light exposure, the vacuum is relieved, the photo-mask removed, and the photopolymer layer developed by a suitable chemical after removing a cover sheet that protects the photo-polymer layer. An etching solution is then applied, wherein the developed photo-polymer layer protects the metal layer underneath. The metal layer in the unexposed areas is removed by the etching solution when a negative photoresist is applied initially to the metal layer. By contrast the metal layer in the exposed areas is removed by the etching solution when a positive photoresist is used. Typically the negative photoresist is the most commonly used photoresist. The aforementioned method of printed circuit board manufacture, also called a subtractive process, employs positive or negative photoresists. When a positive photoresist is used, the areas of the photo-polymer layer exposed to the UV light undergo a physical and chemical change that renders these areas soluble to a developer, thus exposing the metal layer underneath. When a negative photoresist is used, the areas of the photo-polymer layer exposed to the UV light undergo a chemical change to render them insoluble to a developer, thus protecting the metal layer beneath them to an etching solution. The photo-polymer layer is applied to the substrate either as a dry film photoresist or as a liquid photoresist and the dry film layer is usually protected by a transparent cover sheet.

In yet another illustration of the subtractive process, the surfaces of the substrate are chemically treated, metallized, photo-polymer layered, imaged, developed, metal etched, and photo-polymer stripped. By way of an illustration of such a subtractive process, as disclosed in U.S. Pat. Nos. 4,842,946 and 4,873,136 to Foust et al, and incorporated herein by reference, the activation of the surfaces of the substrate such as polyetherimide is accomplished by a chemical modification and plating treatment of the surfaces. The surfaces are adhesion treated by subjecting them to chemical baths, and are then plated with electroless and electrolytic metal. Typically the adhesion treated surfaces are electrolessly plated to form a conductive film, then the film is exposed to electrolytic plating until a conductive layer of desired thickness is achieved. The metallized surfaces are coated with a photoresist layer and then imaged by a UV light passing through a photo-mask. After the removal of the photo-mask, the photoresist layer is developed, and etched to remove the undesired metal. The protective photoresist layer is then removed to produce the desired printed circuit board.

Another method of manufacturing printed circuit boards employs an additive technique wherein the surface of the substrate is selectively activated through a photo-mask by UV radiation and then electrolessly or electrolessly and electrolytically plated. An illustrative procedure is disclosed in U.S. Pat. No. 3,562,005 to DeAngelo et al., and incorporated herein by reference. In the photo-lithographic procedure disclosed in the DeAngelo et al. patent, the substrate to be patterned called the blank, which can be of Ultem ® polyetherimide, is coated with a solution of a photosensitizer, such as stannous chloride. The regions of the surface which are not to be plated are exposed to a UV light to photo-oxidize the stannous ions to stannic ions. After exposure to UV light, the surface is exposed to a solution of palladium chloride. The stannous ions reduce the palladium ions to metallic palladium in the regions that were not exposed to the UV light. However, the stannic ions are not able to reduce the palladium ions, hence no palladium is deposited in the regions exposed to the UV light. The palladium is then used to catalyze the deposition of some other metal such as copper or nickel. The above reaction requires the use of UV light since longer wavelength light does not have sufficient energy to photo-oxidize the stannous ions to stannic ions.

In still another method of manufacturing the printed circuit boards employing the additive technique, the surfaces of a substrate such as, polyetherimide are initially adhesion-treated by subjecting them to a chemical bath. The adhesion treated surfaces are then selectively imaged through the photo-mask by a UV light such that the surface areas of the substrate, exposed to the UV light, are deactivated with respect to plating. As a result when the treated surfaces are exposed to the electroless metal plating, only the unexposed areas on the surfaces are electrolessly plated, thereby forming the desired printed circuit board. Such a method was disclosed by Grubb et al in application Ser. No. 944,728, filed Dec. 22, 1986, now abandoned.

Another method of manufacturing printed circuit boards employs a semi-additive technique wherein the surfaces of the substrate are electrolessly plated, typically to a thickness of about 10 to 100 micro-inches with a metal such as copper. The electroless layer is then coated with a photoresist layer, imaged through a photo-mask, and developed. The metal thickness is then built either electrolessly or electrolytically, typically to about 1.0 to 1.5 mil, the photoresist layer stripped, and the metal differentially etched to produce the printed circuit board. An etch mask, such as a layer of tin/lead, may be used to further protect the desired conductive pattern of copper and eliminate the need for the aforementioned differential etch step, although an etch step is still required.

The aforementioned manufacturing techniques have been used for producing flat printed circuit boards. The photo-mask of the present invention can be used in any one of those techniques. However, unlike the photo-masks of the prior art, the photo-mask of the present invention overcomes the various problems associated with the photo-imaging of three-dimensional substrates produced by any one of the aforementioned methods of manufacturing the printed circuit boards.

Figure 1:
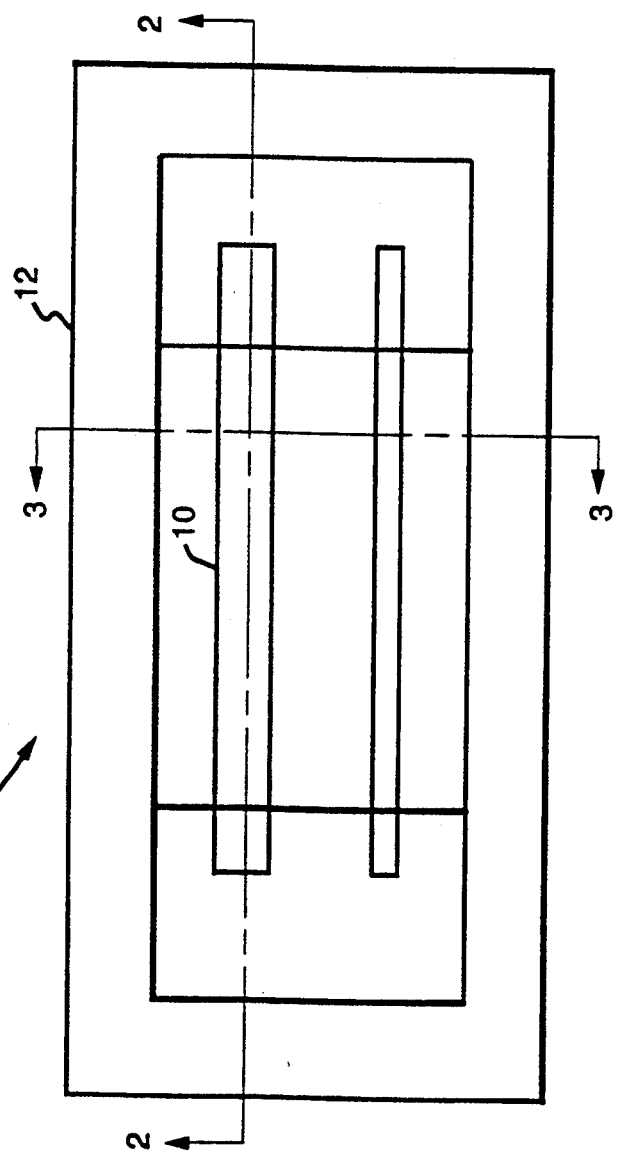
FIG. 1 is a plan view of a photo-mask 1 of the preferred embodiment of the invention.
Figure 2:
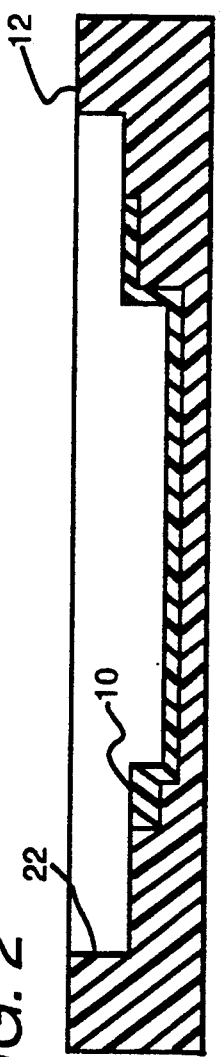
FIG. 2 is a cross-sectional view of the preferred embodiment of FIG. 1 taken along plane 2—2.

Referring now to FIGS. 1, 2 and 3, various views of the preferred embodiment of a photo-mask 1 are illustrated. The tracks 10 positioned along a contour 22 prevent light from a light source of a predetermined range of wavelength used for photo-imaging from reaching the non-selected areas on the surfaces of a three-dimensional substrate. Typically an array of UV light bulbs is used as the light source. A membrane 12, which forms photo-mask 1, has at least one side that conforms to the contoured shape of the surfaces of the three-dimensional substrate subjected to photo-imaging, namely contour 22. Tracks 10 are embedded within membrane 12 in such a way that tracks 10 neither protrude above the surface of contour 22 nor in any way modify contour 22. Membrane 12 is transparent and degradation resistant to the UV light. Membrane 12 may be flexible enough to comply with any surface irregularities of the surfaces of the three-dimensional substrate when photo-mask 1 is pressed against the surfaces of the substrate, and it may be produced from General Electric Company's room temperature vulcanized (RTV) silicones such as mixtures of organopolysiloxanes containing vinyl groups disclosed in, U.S. Pat. No. 3,436,366 to Modic, F. and incorporated herein by reference. However it is contemplated that any similar materials could be used. If desired, a rigid membrane 12 may be formed from transparent polyalkyl methacrylate and more specifically from polymethyl methacrylate or polyethyl methacrylate. The size, thickness and shape of membrane 12 may be made to match the requirements of the photo-imaging equipment in which photo-mask 1 is to be utilized, and it will be obvious to those skilled in the art to include in membrane 12 any hold down or anchoring features such as holes, clips or bolts for facilitating proper installation and alignment of photo-mask 1 within the photo-imaging equipment.

The material of tracks 10 opaque to light from the light source, such as the UV light, has a higher degree of adherence to the material of membrane 12 than it does to the material of the three-dimensional substrate. Tracks 10 may be of the same material as membrane 12, with the exception of their opacity to the UV light. Preferably, the thickness of tracks 10 is less than that of membrane 12. The material of tracks 10 is resistant to degradation by the UV light.

Figure 4:
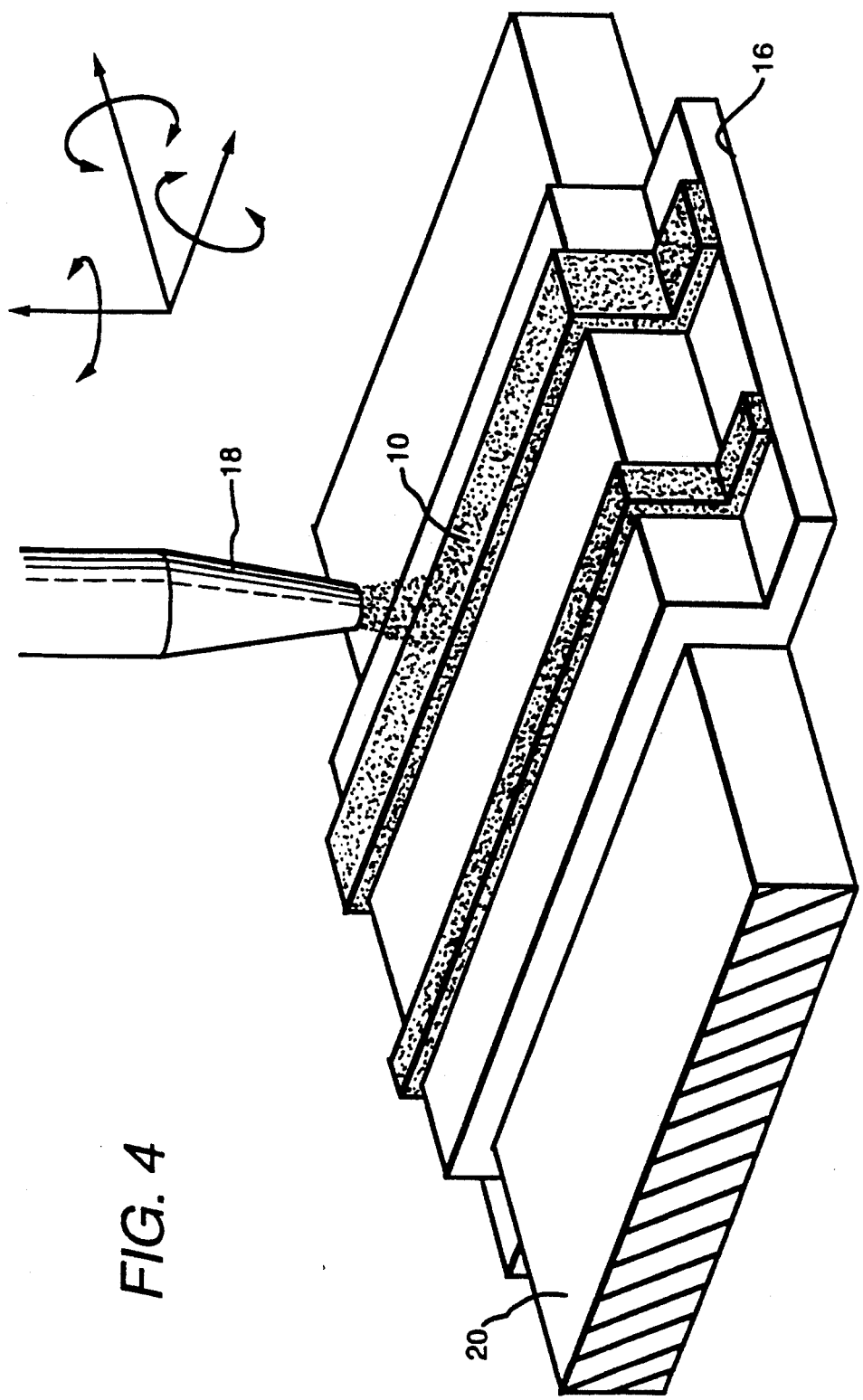
FIG. 4 illustrates a method of preparing the photo-mask 1.

As illustrated in FIG. 4, the photo-mask of the present invention is prepared by first, placing a three-dimensional substrate 16 on a holding fixture 20 having vacuum suction cups to firmly hold substrate 16 without producing any distortion on the surfaces of substrate 16 during the photo-mask preparation. A close contacting photo-mask is produced by providing a substrate holding fixture that does not introduce any distortion on the substrate. It should be understood that the present invention contemplates various other techniques of securing substrate 16 for achieving results similar to those achieved by the use of vacuum suction cups. Preferably substrate 16 is a substrate produced under normal manufacturing conditions, i.e., a truly representative sample produced under actual working conditions. However, a model of substrate 16 that duplicates the surfaces of a substrate produced under manufacturing conditions may be also used.

Once substrate 16 is firmly secured, the material of tracks 10, as shown in FIG. 4, is dispensed upon the desired surfaces of substrate 16. One of the methods of dispensing the material of tracks 10 onto the surfaces of substrate 16 is by injecting means, particularly comprising a dispensing nozzle 18, connected to a syringe-type reservoir containing the material of track 10. Nozzle 18 is maneuvered in a boustrophedonous manner by securing it to a robot governed by controlling means provided by computer software such as CAD/CAM (computer assisted designing and computer assisted manufacturing) programs whereby nozzle 18 is provided a to and from movement directed by the computer programs. The robot, of a type typically used in an automated manufacturing operations, provides nozzle 18 a manipulative freedom along the three major axes as well as the rotational axes. The nozzle 18 is manipulated in a predetermined fashion such that the metal trace pattern desired on substrate 16 can be achieved with a positive or a negative photoresist. The present invention contemplates any other manipulative methods that perform in a similar manner, including moving substrate 16 in a boustrophedonous manner while keeping nozzle 18 stationary.

One of the ways the material of tracks 10 may be injected from nozzle 18 is by injecting means provided by an injector assembly such as a syringe having its plunger pushed forward in a controlled manner by hydraulic means, pneumatic means. The orifice of nozzle 18 may be manually or automatically adjusted in accordance with the required width of the desired track pattern. General Electric Company's one component RTV silicone such as a mixture of black pigmented methoxy terminated polydimethylsiloxane and vinyl trimethoxysilane is a preferred material for tracks 10. U.S. Pat. Nos. 3,635,743; 3,689,454; 3,779,986; 3,856,839; and 4,102,852, incorporated herein by reference, disclose the aforementioned composition. It is understood that in case a two-component room temperature vulcanized composition is used the injector assembly comprises twin syringes, i.e., one containing the desired silicone, the other containing a curing agent necessary for the silcone vulcanization, and if required, means for thoroughly mixing the two components. The material of tracks 10 may be injected in either a liquid or a paste form. The viscosity and the surface tension of the material of tracks 10 should be such that the dispensed tracks of said material on substrate 16 conform to a desired size, shape, and thickness without running or discernibly flowing on the vertical substrate surfaces. However, it is not to be construed that the present invention is restricted to the aforementioned materials.

Figure 5:
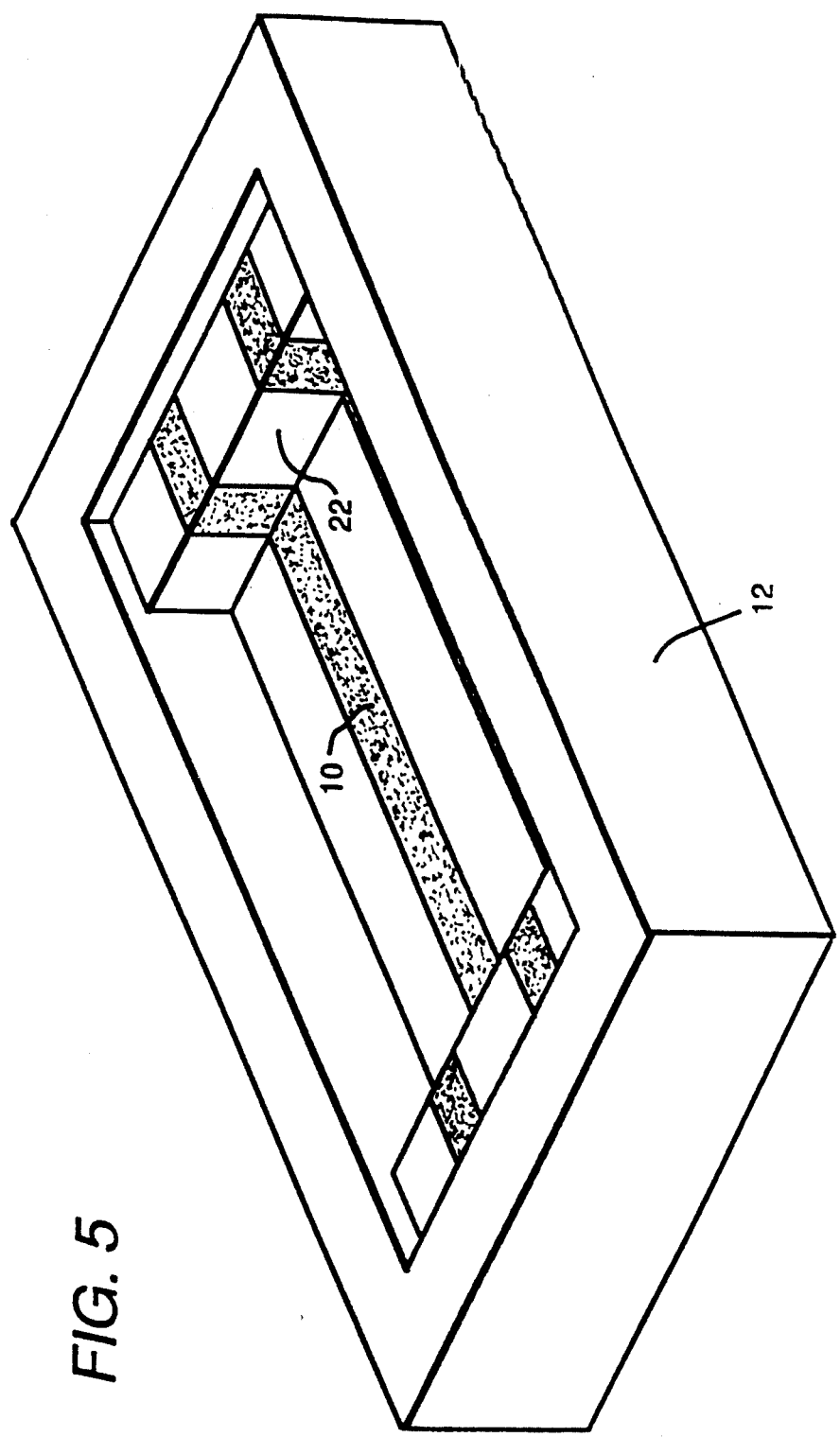
FIG. 5 is a three-dimensional view of the photo-mask 1 of the preferred embodiment.

Once tracks 10, as shown in FIG. 4, are laid out on the surfaces of substrate 16, the material of membrane 12 is supplied to the surfaces containing tracks 10. Typically the material of membrane 12 is poured on top of substrate 16 in a liquid form. Temporary side walls may be erected along the periphery of substrate 16 to contain the material of membrane 12. If necessary, a more permanent box-like arrangement for containing the material could be employed. FIG. 5 illustrates a three-dimensional view of photo-mask 1.

The material of membrane 12 is made to adhere to the material of tracks 10 by either (1) their mutual affinity to adhere to one another; (2) their physical state or (3) an introduction of a bonding material between the two. As a result tracks 10 are embedded within contour 22 of membrane 12.

The material of membrane 12 then sets by a process of vulcanization, whereby the material solidifies into the shape of membrane 12. The rate of vulcanization may be substantially increased by heating the material of membrane 12 to the necessary temperature.

The material of membrane 12 may be supplied as a solid sheet to the surfaces of substrate 16 having tracks 10, said sheet being made of polyalkyl methacrylate. The setting step for transforming the solid sheet into membrane 12 comprises heating the sheet until it becomes pliable enough to conform to the contour and shape of the surfaces of substrate 16 containing tracks 10. Once the sheet in the pliable form conforms to the desired shape it is permitted to cool, till it solidifies into membrane 12. Polyalkyl methacrylate could be also supplied in a liquid form by dissolving it in a solvent such as toluene and then permitting polyalkyl methacrylate to set by evaporating the solvent.

Finally membrane 12 is separated from substrate 16 wherein tracks 10 are embedded in membrane 12 to form the desired photo-mask of the present invention. As shown in FIG. 5, membrane 12 has at least one side, contour 22, shaped to conform to the surfaces of substrate 16 that is to be photo-imaged.

In another embodiment of the photo-mask as illustrated in FIGS. 6, 7, and 8, a membrane 24 of photo-mask 2 has a uniform wall thickness that follows the shape of contour 22.

A photo-mask 3 of FIGS. 9 and 10 shows various views of yet another embodiment of the present invention. A membrane 27 had at least one side with a contour 29 that conformed to the surfaces of the three-dimensional substrate that was to be photo-imaged. Membrane 27 was flexible enough to comply with any surface irregularities of the surfaces of the three-dimensional substrate, when photo-mask 3 was pressed against the surfaces of the substrate, and was produced from General Electric Company's room temperature vulcanized (RTV) silicones such as mixtures of organopolysiloxanes containing vinyl groups, disclosed in U.S. Pat. No. 3,436,366, Modic, F., and incorporated herein by reference. However it is contemplated that any similar materials could be used. If desired, a rigid membrane 27 may be formed from transparent polyalkyl methacrylate and more specifically from polymethyl methacrylate or polyethyl methacrylate. The size, thickness and shape of membrane 27 is made to match the requirements of the photo-imaging equipment in which photo-mask 3 is to be utilized. It will be obvious to those skilled in the art to include in membrane 27 any hold-on or anchoring features such as holes, clips or boards for facilitating proper installation and alignment of photo-mask 3 within the photo-imaging equipment.

Channels 31, as shown in FIG. 9, were located along contour 29 and were positioned and shaped in accordance with the conductive trace pattern desired on the surfaces of a three-dimensional substrate. Channels 31 contained an opaque material that formed opaque tracks 33 shown in FIG. 10. The materials of opaque tracks 33 and membrane 27 were resistant to degradation by the UV light. Same material could be used for opaque tracks 33 and membrane 27 provided membrane 27 is transparent to and tracks 33 are opaque to the UV light.

Figure 11:
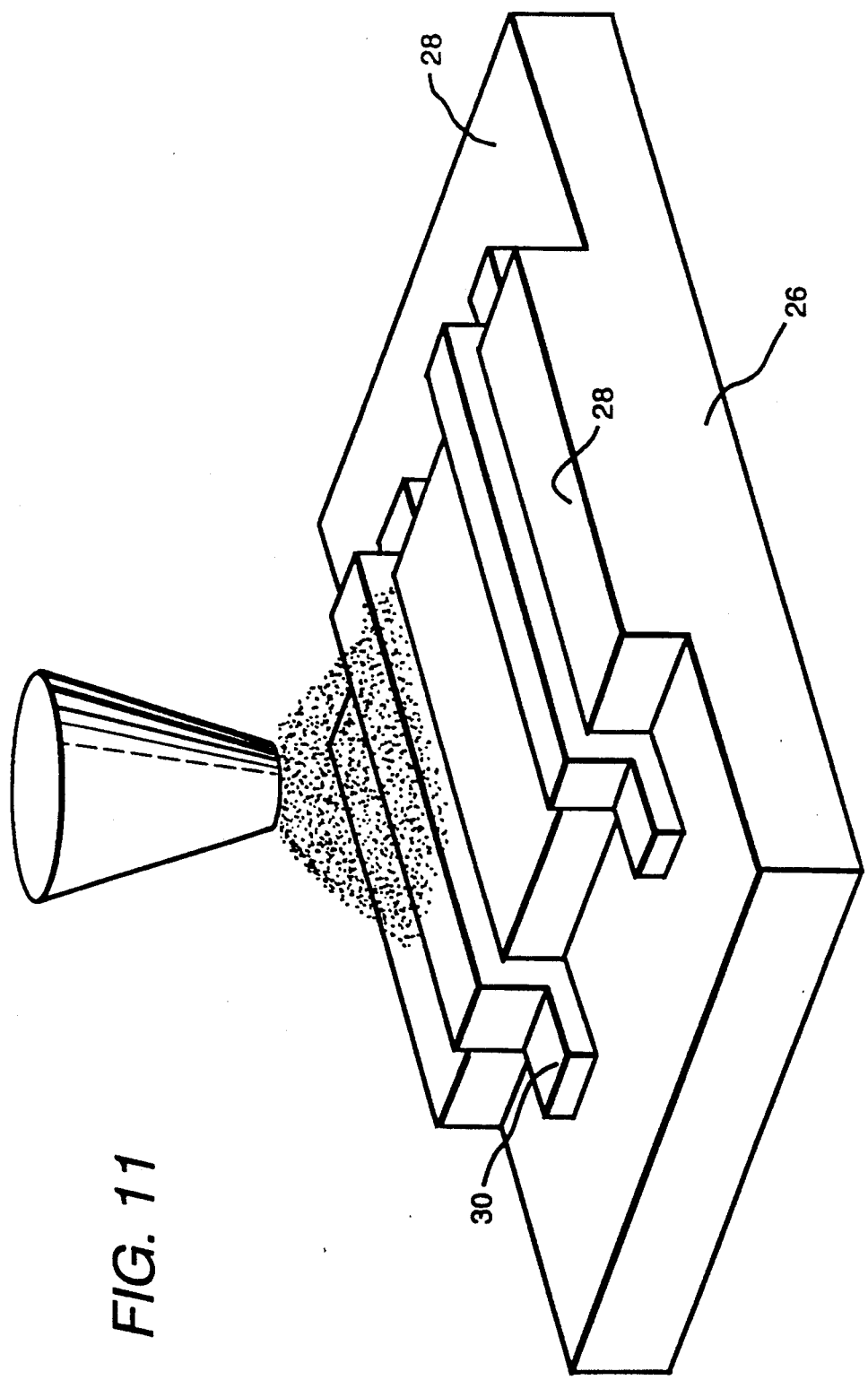
FIG. 11 illustrates a method of preparing the photo-mask 3.

As shown in FIG. 11, the photo-mask 3 of the present invention was prepared by molding a transparent material of membrane 27 of photo-mask 3 over a mold having a core 26 with a contour 28 and a desired pattern of raised ribs 30. Contour 28 matches the contour of the surfaces of the substrate to be photo-imaged. Once the membrane material was molded, into a membrane 27, shown in FIGS. 9 and 10, it was separated from the mold. Thus, membrane 27 having a pattern of channels 31, as shown in FIG. 9, was formed by the raised ribs 30 of core 26. Contour 29 of membrane 27 conforms to contour 28 of core 26.

Next, the material of opaque tracks 33 was filled into channels 31 to form a pattern of tracks 33 opaque to UV light and any excess track material was removed by cleaning means such as a squeegee from the surfaces of contour 29 of membrane 27. Once the track material was set in channels 31, photo-mask 3 of the present invention was formed.

Figure 12:
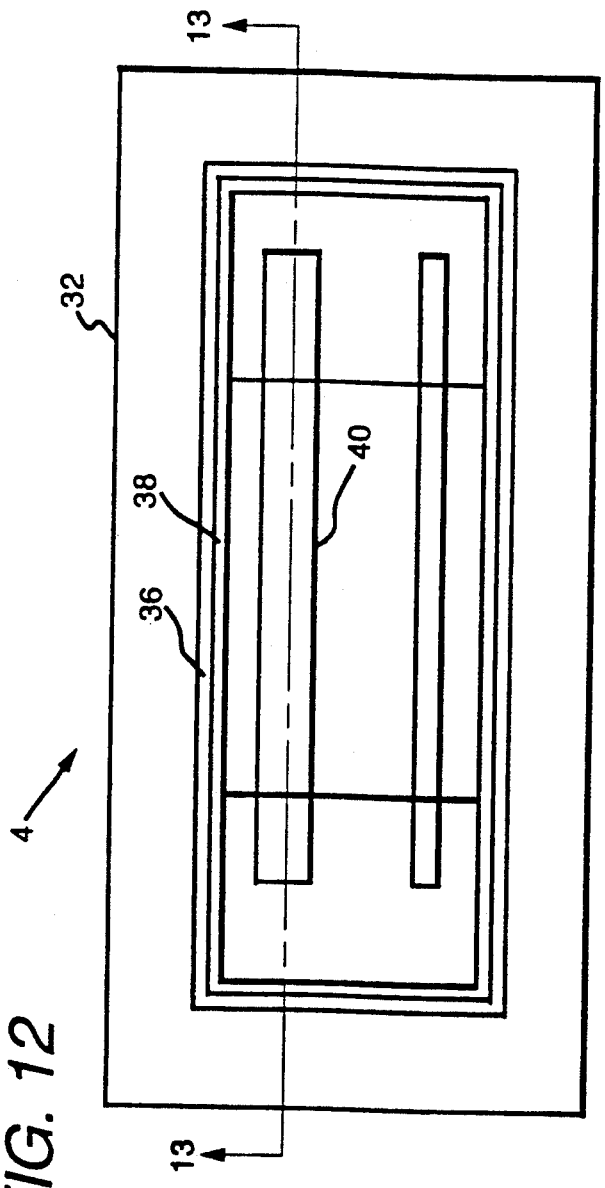
FIG. 12 is a plan view of a photo-mask 4 of yet another embodiment of the invention.
Figure 13:
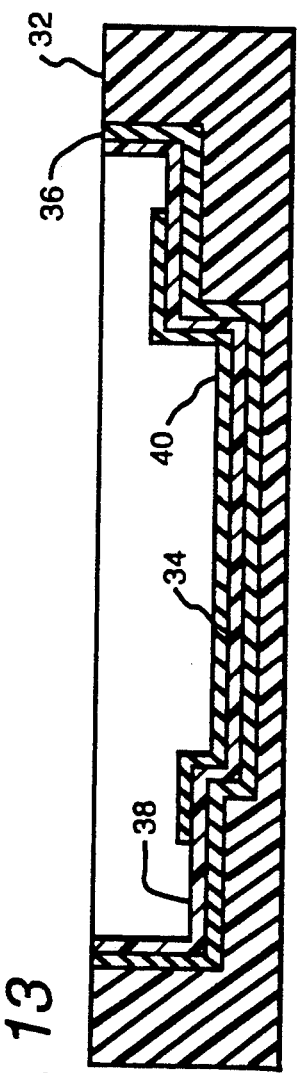
FIG. 13 is a cross-sectional view of the embodiment of FIG. 12 taken along plane 13—13.

The photo-mask 4 of FIGS. 12 and 13 shows various views of yet another embodiment of the present invention. A membrane 32 had at least one side with a contour 34 that conformed to the surfaces of the three-dimensional substrate that was to be photo-imaged. Membrane 32 was flexible enough to comply with any surface irregularities of the surfaces of the three-dimensional substrate, when photo-mask 4 was pressed against the surfaces of the substrate, and was produced from General Electric Company's room temperature vulcanized (RTV) silicones such as mixtures of organopolysiloxanes containing vinyl groups, disclosed in U.S. Pat. No. 3,436,366 Modic, F., and incorporated herein by reference. However it is contemplated that any similar materials could be used. If desired, a rigid membrane 32 may be formed from transparent polyalkyl methacrylate and more specifically from polymethyl methacrylate or polyethyl methacrylate. The size, thickness and shape of membrane 32 may be made to match the requirements of the photo-imaging equipment in which photo-mask 4 is to be utilized, and it will be obvious to those skilled in the art to include in membrane 32 any hold down or anchoring features such as holes, clips or bolts for facilitating proper installation and alignment of photo-mask 4 within the photo-imaging equipment.

An adhesive layer 36 disposed along contour 34 cemented contour 34 to fluorinated polymer film 38 that conformed to the shape of contour 34. Typically a perfluoroalkoxy Teflon ® or fluorinated ethylene-propylene Teflon ® film is used. The thicknesses of adhesive layer 36 and film 38 were such that their combined thicknesses did not significantly distort or modify the shape of contour 34. Adhesive layer 36 had enough adhesive strength to prevent delamination of film 38 from contour 34 during normal operating conditions to which photo-mask 4 was subjected to. Membrane 32, adhesive layer 36 and film 38 were transparent and degradation resistant to the UV light.

Next an opaque pattern of tracks 40, as shown in FIG. 13, was located along the exposed side of film 38. The opaque pattern of tracks 40 was patterned in accordance with a conductive metal trace pattern desired on the three-dimensional substrate when photo-mask 4 was used during the photo-imaging process. The opaque pattern of tracks 40 comprised a titanium layer in contact with film 38 followed by a layer of chromium, aluminum or copper deposited on top of the titanium layer. The combined thickness of the various layers comprising opaque pattern of tracks 40 had no significant impact in either distorting or modifying contour of membrane 32. The opaque pattern of tracks 40 was adherent enough to film 38 to prevent delamination during the normal operating conditions. The opaque pattern of tracks 40 was opaque to light from the light source, such as the UV light.

The photo-mask 4 of the present invention was prepared by placing film 38 of about 0.5 mil thickness onto holding means such a surface having a series of capillary holes through which vacuum could be applied to fixedly hold film 38 in place on the surface during the photo-mask preparation. The aforementioned surface may be flat. Next, an opaque layer was deposited over an exposed side of film 38. One of the methods of depositing the opaque layer is to first evaporate a metal layer of titanium having a thickness of about 1000 Å on the exposed surface of film 38. Then, a metal layer of chromium. aluminum or copper having a thickness of about 10,000 Å was evaporated over the titanium layer. It should be understood that the type of metals applied or the number of layers deposited on film 38 is not critical. Conventional techniques such as vacuum metallizing may be used for evaporating these metal layers on film 38.

The opaque layer was patterned to produce an opaque pattern 40 thereon. One of the ways opaque pattern 40 may be be made is by photo-patterning the opaque layer. A layer of photoresist, preferably a negative photoresist in a liquid form, was applied over the opaque layer. Methods for applying the photoresist include spin coating, spraying, and electrostatic spraying. Once the photoresist dried a compensated photo-mask such as a flat polyester photo-mask incorporating a desired pattern was then placed over the exposed surface of film 38 containing the aforementioned opaque layer and the photoresist layer. The flat polyester photo-mask could have a light field or a dark field pattern suitable for exposing a positive or a negative photoresist layer applied over the surfaces of a three-dimensional substrate, and the pattern be compensated or distorted to take into account the three-dimensional shape of the substrate that is to be photo-imaged.

The photoresist layer was photo-imaged under an actinic light such as the UV light to expose the non-selected areas of the photoresist layer. The polyester photo-mask was then removed, the photoresist layer developed to expose the opaque layer underneath the non-selected areas, the non-selected areas of opaque layer etched, and the remaining photoresist layer protecting selected areas of the opaque layer stripped to form a pattern 40, opaque to the UV light, on the exposed side of film 38.

The opaque pattern 40 on photo-mask 4 of the present invention was also made by the additive or semi-additive techniques of printed circuit board manufacturing explained earlier.

Film 38 was then aligned and placed over the surfaces of an actual substrate that was to be photo-imaged. A close contacting photo-mask was produced by providing substrate securing means such as a substrate holding platform that did not introduce any distortion on the substrate. It should be understood that the present invention contemplates various other techniques of securing substrates for achieving results similar to those achieved by the use of vacuum suction cups. Preferably the substrate secured onto the holding platform is a substrate produced under normal manufacturing conditions, i.e., a truly representative sample produced under actual working conditions. However, a model of the substrate that duplicates the features of the substrate produced under manufacturing conditions may be also used.

The side of film 38 containing opaque pattern 40 was in proximate contact with the surfaces of the substrate. Vacuum was then applied through series of capillary holes positioned along the surfaces of the substrate being photo-imaged so that film 38 was deformed by vacuum to conform to the contoured shape of the surfaces being photo-imaged. It is contemplated that any other means to shape film 38 may be utilized. Adhesive layer 36 was then evenly applied over the surfaces of an unexposed and non-patterned side of film 38. The material of membrane 32 was then supplied by pouring it over adhesive layer 36 to form membrane 32. Adhesive layer 36, capable of cementing film 38 to contour 34 of membrane 32, had enough adhesive strength to prevent delamination of film 38 from contour 34 during normal working conditions to which photo-mask 4 was subjected. Once material of membrane 32 set, and was separated from the three-dimensional substrate, photo-mask 4 of the present invention was formed.

Figure 14:
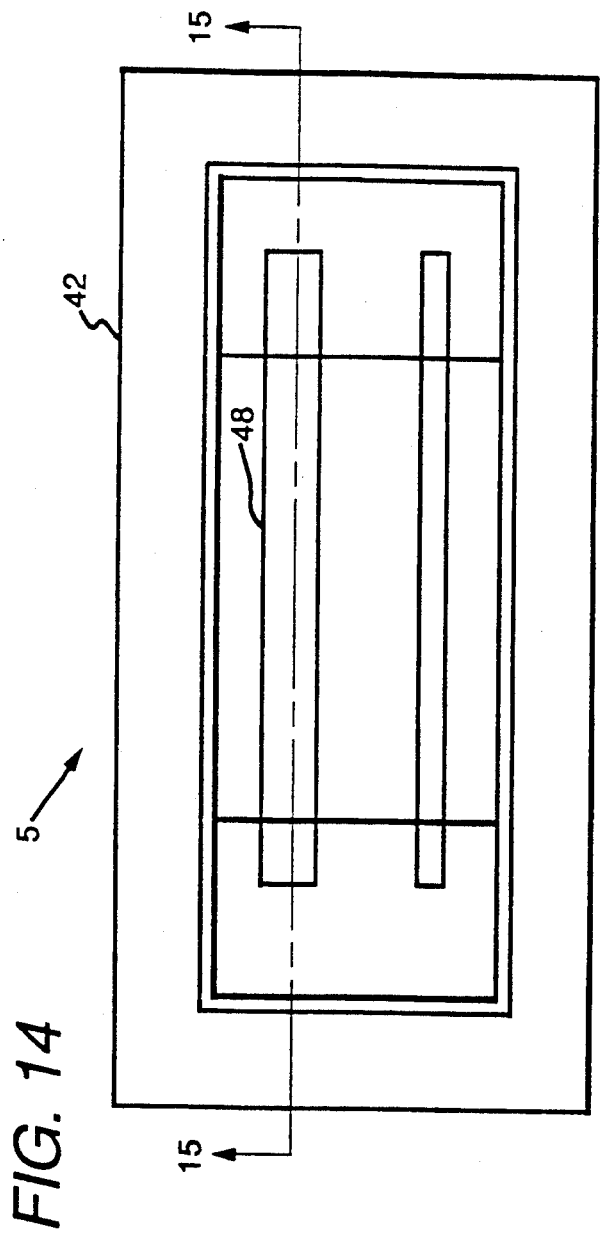
FIG. 14 is a plan view of a photo-mask 5 of yet another embodiment of the invention.
Figure 15:
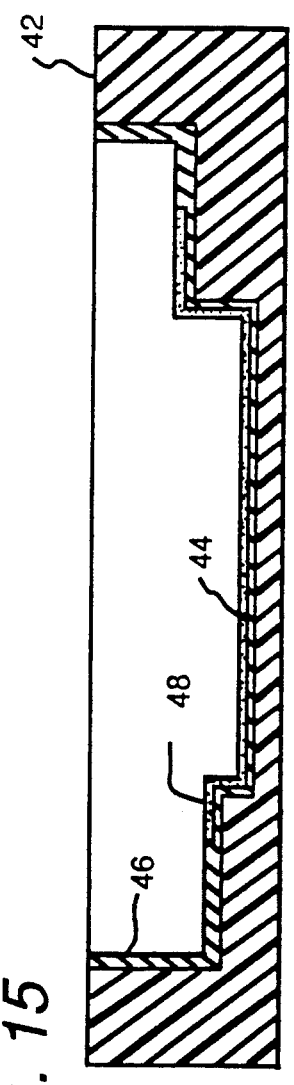
FIG. 15 is a cross-sectional view of the embodiment of FIG. 14 taken along plane 15—15.

The photo-mask 5 of FIGS. 14 and 15 shows various views of still another embodiment of the present invention. Membrane 42 had at least one side with a contour 44 that conformed to the surfaces of a three-dimensional substrate that was to be photo-imaged. Membrane 42 was flexible enough to comply with surface irregularities of the surfaces of the three-dimensional substrate when photo-mask 5 was pressed against the surfaces of the substrate. Membrane 42 was produced from the General Electric Company's room temperature vulcanized (RTV) silicones such as mixtures of organopolysiloxanes containing vinyl groups disclosed in U.S. Pat. No. 3,436,366 Modic, F. and incorporated herein by reference. However it is contemplated that any similar materials could be used. If desired, a rigid membrane 42 may be formed from transparent polyalkyl methacrylate and more specifically from polymethyl methacrylate or polyethyl methacrylate. The size, thickness and shape of membrane 42 may be made to match the requirements of the photo-imaging equipment in which photo-mask 5 is to be utilized, and it will be obvious to those skilled in the art to include in membrane 42 any hold down or anchoring features such as holes, clips or bolts for facilitating proper installation and alignment of photo-mask 5 within the photo-imaging equipment.

An adhesive layer 46 positioned along contour 44 conformed to the shape of contour 44 and contained a cemented opaque pattern of tracks 48 enclosed within adhesive layer 46. However, it is contemplated that opaque pattern of tracks 48 could also protrude above adhesive layer 46, provided the combined thickness of adhesive layer 46 and opaque pattern of tracks 48 did not significantly distort or modify the shape of contour 44. Adhesive layer 46, capable of cementing opaque pattern of tracks 48 to contour 44 of membrane 42, had enough adhesive strength to prevent delamination of opaque pattern of tracks 48 from contour 44 during normal working conditions to which photo-mask 5 was subjected to. Membrane 42 and adhesive layer 46 were transparent and degradation resistant to the UV light.

Opaque pattern of tracks 48 patterned in accordance with a conductive trace pattern desired on the three-dimensional substrate when photo-mask 5 was used for photo-imaging during the manufacturing of the three-dimensional printed circuit board. Opaque pattern of tracks 48 comprised a patterned layer of copper in contact with adhesive layer 46. It is contemplated that any suitable material capable of depositing and adhering to contour 44 of membrane 42 could be also used. Opaque pattern of tracks 48 was opaque and degradation resistant to light from the light source, such as the UV light.

The photo-mask 5 of the present invention was prepared by first adhesion treating one side of a polyetherimide carrier film of 5 mil thickness by exposing it to suitable chemical treatments known in the art such that the exposed side of the carrier film was activated with respect to plating. Prior to the aforementioned adhesion treatment, the non-treated side was masked to prevent its exposure to the chemical bath. After placing the carrier film with the non-exposed masked side in proximate contact with a surface such as a flat surface having holding means to hold the carrier film fixedly in place, a compensated photo-mask such as a flat quartz photo-mask was contacted with the activated side of film and then selectively imaged through the compensated photo-mask by the UV light, such that nonselected portions on the activated side, exposed to the UV light, were deactivated with respect to plating. The compensated photo-mask could have a light field or a dark field pattern suitable for exposing a positive or a negative photoresist to the UV light. The compensated photo-mask was compensated or distorted to take into account the three-dimensional shape of the substrate that was to be photo-imaged.

After removing the carrier film from the aforementioned surface, the non-exposed side of the carrier film was unmasked. The carrier film having the deactivated non-selected portions on the activated exposed side was then aligned over a three-dimensional substrate whose surfaces are to be photo-imaged, with the non-exposed side in proximate contact with the surfaces of the three-dimensional substrate. A close contacting photo-mask was produced by providing a substrate securing means that did not introduce any distortion on the substrate. It should be understood that the present invention contemplates various other techniques of securing substrates for achieving results similar to those achieved by the use of vacuum suction cups. Preferably the substrate secured in the securing means is a substrate produced under normal manufacturing conditions, i.e., a truly representative sample produced under actual working conditions. However, a model of the substrate that duplicates the features of the substrate produced under manufacturing conditions may be also used.

Figure 16:
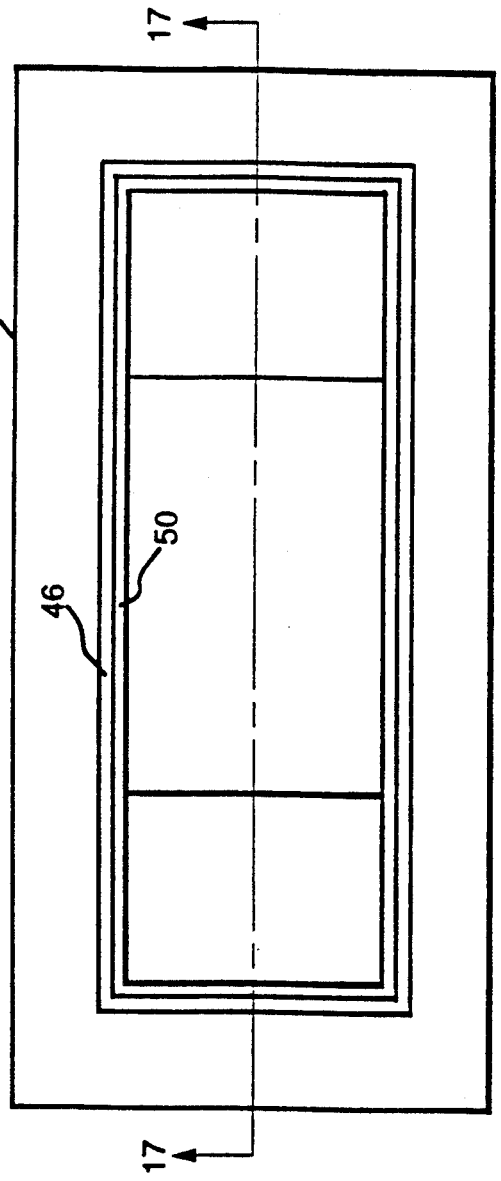
FIG. 16 is a plan view of a photo-mask 5 before the removal of the formed film.
Figure 17:
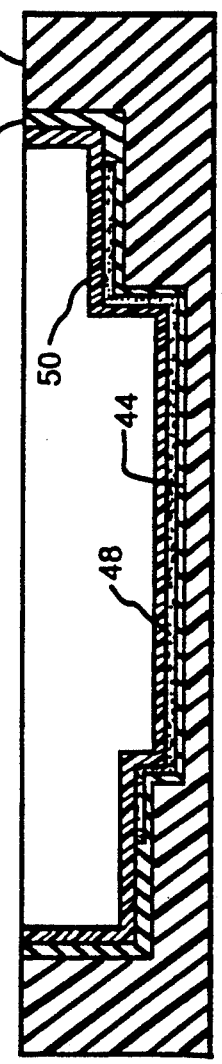
FIG. 17 is a cross-sectional view of the embodiment of FIG. 16 taken along plane 17—17.

Next the carrier film was deformed so as to conform to a contoured shape of the surfaces of the three-dimensional substrate. One of the ways the carrier film could be deformed is by a process of thermo-forming. The substrate surfaces were provided with a series of capillary holes through which vacuum could be applied. By the application of vacuum and heat the polyetherimide carrier film was thermo-formed to conform to the contoured shape of the surfaces of the three-dimensional substrate being photo-imaged. FIGS. 16 and 17 show a formed carrier film 50. It is contemplated that any other means to shape the carrier film into formed carrier film 50 may be utilized. Formed carrier film 50 was removed from the substrate and the activated side of formed film carrier 50 was then electrolessly plated with metal whereby a metal is chemically deposited on the selected portions on the activated side of formed carrier film 50 to form the opaque pattern of tracks 48. A solution of metal ions such as copper may be used to deposit the electroless copper only on the selected portions on the activated side of formed carrier film 50, unexposed during the actinic light exposure. The aforementioned opaque pattern of tracks 48, deposited on the activated side of formed carrier film 50, was opaque to the UV light. An adhesive was then evenly applied to form an adhesive layer 46 over the exposed side of formed carrier film 50, containing opaque pattern of tracks 48. The material of membrane 42 was then supplied by pouring it over adhesive layer 46. After membrane 42 was set, it was separated from the substrate to form membrane 42. One of the ways in which membrane 42 could be set is by a process of vulcanization whereby the membrane material solidifies into membrane 42. The process of vulcanization may be accelerated by providing heat to the membrane material during the process of vulcanization. Membrane 42 having formed carrier film 50 was disposed of by chemical baths capable of dissolving polyetherimide formed carrier film 50 from membrane 42. Methylene chloride was used for dissolving polyetherimide carrier film 50. However any other means for disposing of carrier film 50 may be used. Thus, formed carrier film 50 was then disposed of from membrane 42, to produce photo-mask 5 of the present invention was prepared.

Figure 18:
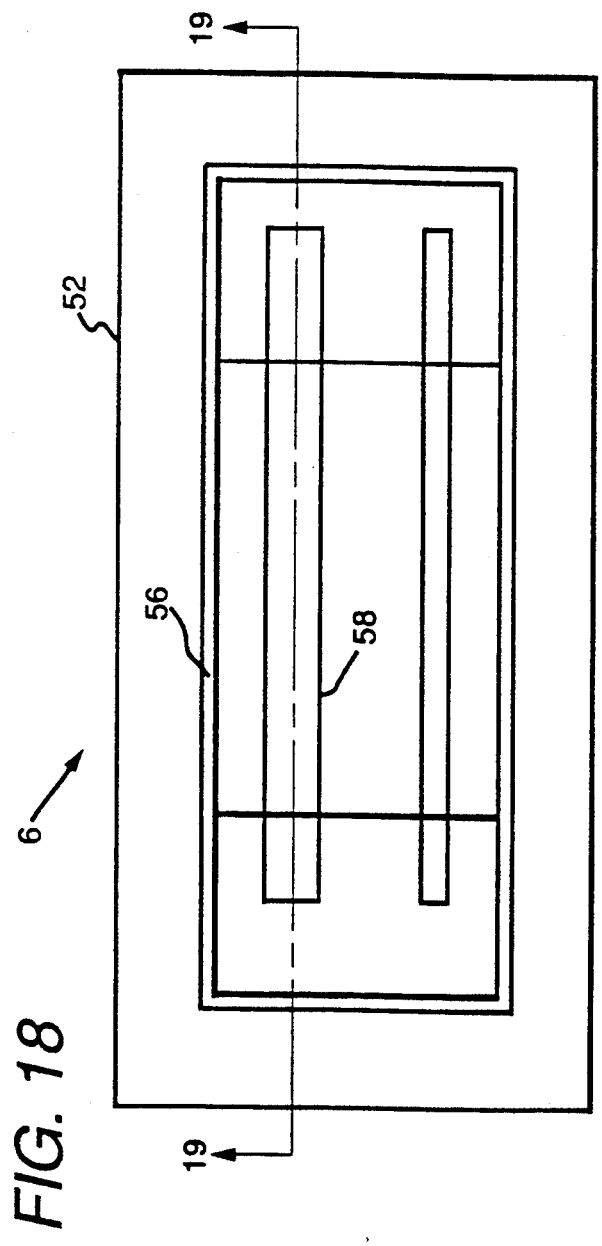
FIG. 18 is a plan view of a photo-mask 6 of yet another embodiment of the invention.
Figure 19:
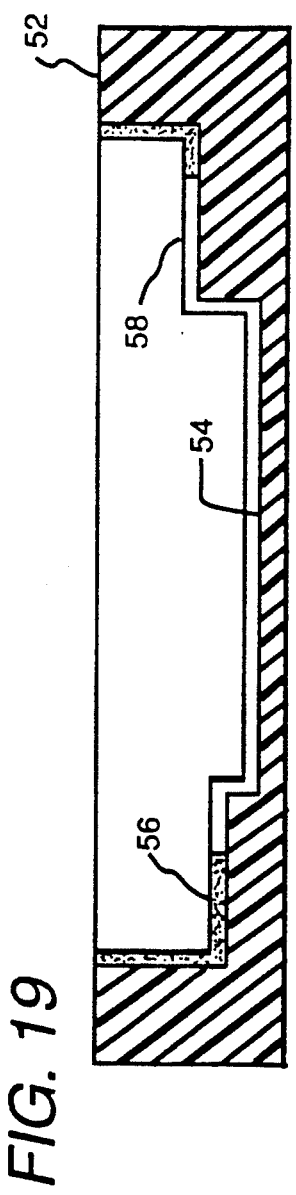
FIG. 19 is a cross-sectional view of the embodiment of FIG. 18 taken along plane 19—19.

The photo-mask 6 of FIGS. 18 and 19 shows various views of yet another embodiment of the present invention. An opaque layer 56 had at least one side with a contour 54 that conformed to the surfaces of a three-dimensional substrate that was to be photo-imaged. A membrane 52 was positioned on a side of opaque layer 56 not having contour 54. Opaque layer 56 positioned along contour 54 had a pattern of laser scribed grooves 58 that allowed passage of the UV light, when photo-mask 6 was contacted with a three dimensional substrate being photo-imaged during the manufacture of the three-dimensional printed circuit board. Grooves 58 were positioned and shaped in accordance with the conductive trace pattern desired on the three-dimensional substrate. The pattern of grooves 58 could have a light field or a dark field pattern suitable for exposing a positive or a negative photoresist to the UV light of the surfaces of a three-dimensional substrate that is to be photo-imaged.

Membrane 52 was transparent to, and resistant to degradation by the UV light. Membrane 52 was flexible enough to comply with any surface irregularities of the surfaces of the three-dimensional substrate when photo-mask 6 was pressed against the surfaces of the substrate. The photo-mask 6 was produced from the General Electric Company's room temperature vulcanized (RTV) silicones such as mixtures of organopolysiloxanes containing vinyl groups disclosed in U.S. Pat. No. 3,436,366 Modic, F. and incorporated herein by reference. However it is contemplated that any similar materials could be used. If desired, a rigid membrane 52 may be formed from transparent polyalkyl methacrylate and more specifically from polymethyl methacrylate or polyethyl methacrylate. The size, thickness and shape of membrane 52 may be made to match the requirements of the photo-imaging equipment in which photo-mask 6 is to be utilized, and it will be obvious to those skilled in the art to include in membrane 52 any hold down or anchoring features such as holes, clips or bolts for facilitating proper installation and alignment of photo-mask 6 within the photo-imaging equipment.

The material of opaque layer 56 was impervious to light from the light source, such as the UV light and had a higher degree of adherence to the material of membrane 52 than it did to the surfaces of the three-dimensional substrate. Opaque layer 56 may be of the same material as membrane 52, with the exception of its opacity to the UV light. Preferably the thickness of opaque layer 56 is less than that of membrane 52. The material of opaque layer 56 is resistant to degradation by the UV light.

Photo-mask 6 of the present invention was prepared by first placing a three-dimensional substrate to be photo-imaged on securing means having vacuum suction cups to firmly hold the three-dimensional substrate without producing any significant distortions on the surfaces of the substrate during the photo-mask preparation. A close contacting photo-mask was produced by providing substrate securing means that did not introduce any distortion on the substrate. It should be understood that the present invention contemplates various other techniques of securing substrates for achieving results similar to those achieved by the use of vacuum suction cups. Preferably the substrate secured in the securing means is a substrate produced under normal manufacturing conditions, i.e., a truly representative sample produced under actual working conditions. However, a model of the substrate that duplicates the features of the substrate produced under manufacturing conditions may be also used.

Once the substrate was firmly secured, the material of opaque layer 56 was supplied by pouring it upon the desired surfaces of the substrate as uniformly as possible during the pouring step so as to maintain a uniform wall thickness. However uniformity of thickness is not an essential feature of photo-mask 6. After layer 56 set, the material of membrane 52 was supplied by pouring it on top of a side of opaque layer 56 not in contact with the surfaces of the three-dimensional substrate. Preferably the material of membrane 52 is supplied in a liquid form. Temporary sidewalls may be erected along the periphery of the secured substrate to contain the material of membrane 52. If necessary, a more permanent box-like arrangement for containing the material could be employed. The material of membrane 52 then set by a process of vulcanization, whereby the material solidified into the shape of membrane 52. The aforementioned process of vulcanization may be accelerated by providing heat to the material of membrane 52.

Finally membrane 52 having opaque layer 56 therein, was separated from the substrate and a laser such as a frequency-doubled Nd-YAG laser was used to create the pattern of grooves 58 on opaque layer 56 by ablating away selected portions of opaque layer 56. Grooves 58 were made in accordance with the metal trace pattern desired on the three-dimensional substrate. The boustrophedonous movement of the laser beam necessary to create grooves 58 on opaque layer 56 could be provided by a robot controlled through controlling means provided by a CAD/CAM computer software program. However the present invention contemplates similar methods that can provide the necessary movement to the laser used during the ablation of opaque layer 56, including moving the substrate in a boustrophedonous manner while keeping the laser beam stationary. The pattern of grooves 58 allow passage of the UV light to expose selected areas on the surfaces of the three-dimensional substrate when it is imaged through photo-mask 6 of the present invention. The pattern of grooves 58 could be a dark field or light field pattern suitable for exposing either a positive or a negative photoresist layer applied over the surfaces of the three-dimensional substrate that is to be photo-imaged.

Figure 20:
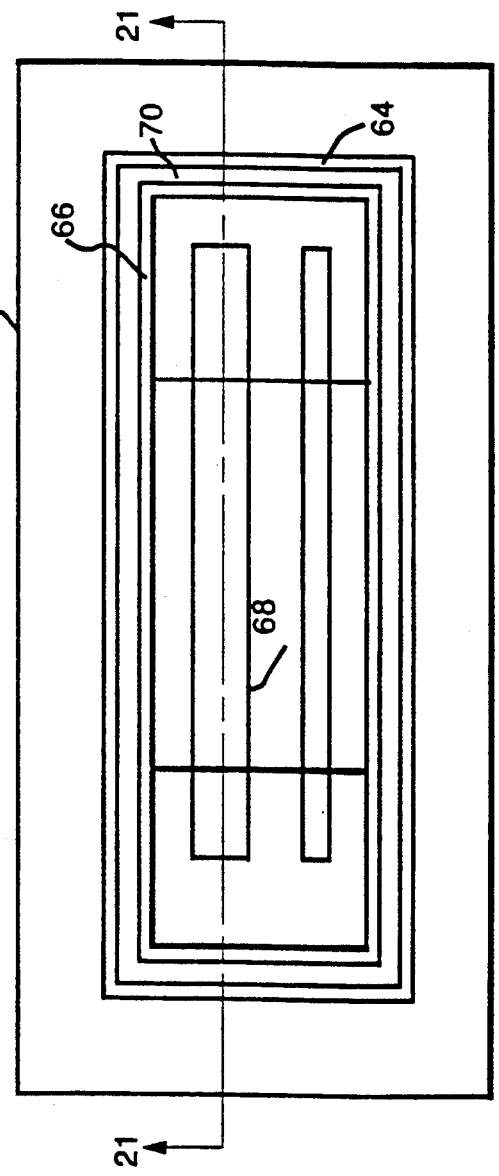
FIG. 20 is a plan view of a photo-mask 7 of still another embodiment of the invention.
Figure 21:
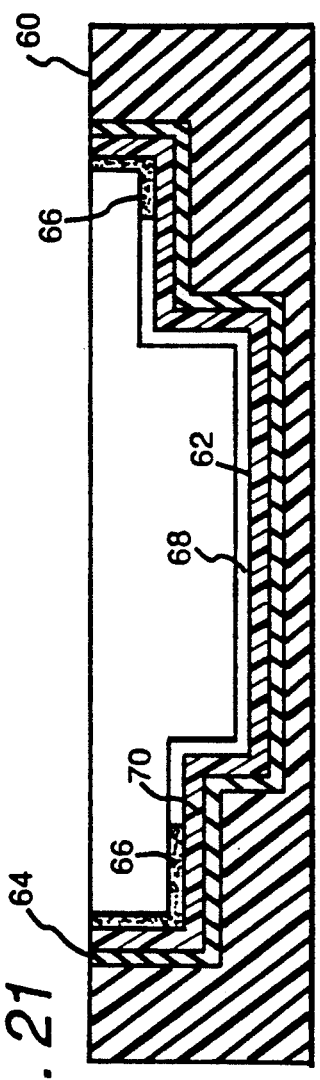
FIG. 21 is a cross-sectional view of the embodiment of FIG. 20 taken along plane 21—21.

The photo-mask 7 of FIGS. 20 and 21 shows various views of yet another embodiment of the present invention. Membrane 60 had at least one side with a contour 62 that conformed to the surfaces of a three-dimensional substrate that was to be photo-imaged. An adhesive layer of 64 positioned along contour 62 cemented a fluorinated polymer film 70 conformed to the shape of contour 62. Typically a perfluoroalkoxy Teflon ® or fluorinated ethylene-propylene Teflon ® film is used. The thicknesses of adhesive layer 64 and film 70 were such that their combined thicknesses did not significantly distort or modify the shape of contour 62. Adhesive layer 64 capable of cementing film 70 to contour 62 of membrane 60, had enough adhesive strength to prevent delamination of film 70 from contour 62 during normal operating conditions to which photo-mask 7 was subjected to. Membrane 60, adhesive layer 64 and film 70 were transparent and degradation resistant to the UV light.

An opaque layer 66, as shown in FIGS. 20 and 21, was located on the exposed side of film 70. Opaque layer 66 comprised a titanium layer in contact with film 70 followed by a layer of chromium, aluminum or copper deposited on top of the titanium layer. The combined thickness of the various layers comprising opaque layer 66 did not significantly distort or modify contour 62 of membrane 60. Opaque layer 66 was adherent enough to film 70 to prevent delamination during the normal operating conditions. Opaque layer 66 was opaque to light from the light source, such as the UV light. Opaque layer 66 had a desired pattern of laser scribed grooves 68 as shown in FIGS. 20 and 21 that allowed the transmission of the UV light, when photo-mask 7 was contacted with the surfaces of the three-dimensional substrate being photo-imaged during the manufacturer of the three-dimensional printed circuit board. Membrane 60 was transparent, and resistant to degradation by the UV light. Membrane 60 was flexible enough to comply with surface irregularities of the surfaces of the three-dimensional substrate when photo-mask 7 was pressed against the surfaces of the substrate. The photo-mask 7 was produced from the General Electric Company's room temperature vulcanized (RTV) silicones such as mixtures of organopolysiloxanes containing vinyl groups disclosed in U.S. Pat. No. 3,436,366, Modic, F., and incorporated herein by reference. However it is contemplated that any similar materials could be used. If desired, a rigid membrane 60 may be formed from transparent polyalkyl methacrylate and more specifically from polymethyl methacrylate or polyethyl methacrylate. The size, thickness and shape of membrane 60 may be made to match the requirements of the photo-imaging equipment in which photo-mask 7 is to be utilized, and it will be obvious to those skilled in the art to include in membrane 60 any hold down or anchoring features such as holes, clips or bolts for facilitating proper installation equipment.

The photo-mask 7 of the present invention was prepared by placing film 70 of about 0.5 mil thickness on a surface, such as a flat surface having capillary holes drilled across the surface. Holding means were provided by vacuum applied through the capillary holes to fixedly hold film 70 in place. Next, opaque layer 66 was deposited on the exposed side of film 70. One of the methods of depositing is by evaporating a metal layer of titanium having a thickness of about 1,000 Å on the exposed surface of film 70. Then, a metal layer of chromium, aluminum or copper having a thickness of about 10,000 Å was evaporated over the titanium layer. It should understood that the type of metals applied or the number of layers deposited on film 70 is not critical. Conventional techniques such as vacuum metallizing may be used for evaporating these metal layers on film 70.

Film 70 was then aligned and placed over the surfaces of the three-dimensional substrate that was to be photo-imaged. A close contacting photo-mask was produced by providing substrate securing means that did not introduce any distortion on the substrate. It should be understood that the present invention contemplates various other techniques of securing substrates for achieving results similar to those achieved by the use of vacuum suction cups. Preferably the substrate secured in the securing means is a substrate produced under normal manufacturing conditions, i.e., a truly representative sample produced under actual working conditions. However, a model of the substrate that duplicates the features of the substrate produced under manufacturing conditions may be also used.

The exposed side of film 70 containing the opaque layer 66 was in proximate contact with the surfaces of the substrate. Film 70 was then deformed to conform it to a contoured shape of the surfaces of the three-dimensional substrate. One of the methods of deforming film 70 is by applying vacuum series of capillary holes positioned along the surfaces of the substrate being photo-imaged so that film 70 was deformed by vacuum to conform to the contoured shape of the surfaces of the three-dimensional substrate that is to be photo-imaged. It is contemplated that any other means to shape film 70 may be utilized. Adhesive layer 64 was then evenly applied over the unexposed side of film 70 i.e. the side not having opaque layer 66. The material of membrane 60 was supplied to adhesive layer 64 by pouring it over adhesive layer 64. Adhesive layer 64, capable of cementing film 70 to contour 62 of membrane 60, had enough adhesive strength to prevent delamination of film 70 from contour 62 during normal working conditions to which photo-mask 7 was subjected to. Once material of membrane 60 set, membrane 60 was formed and it was then removed from the substrate.

Finally, a laser such as a frequency-doubled Nd-YAG laser was used to create a desired pattern of grooves 68 on opaque layer 66 by ablating away the selected portions from opaque layer 66. Desired pattern of grooves 68 was made in accordance with the metal trace pattern desired on the three-dimensional substrate. The boustrophedonous movement of the laser beam necessary to create the desired pattern of grooves 68 on metal layer 66 could be provided by a robot controlled through controlling means provided by a CAD/CAM computer computer software program. However the present invention contemplates any other manipulative methods that can provide the necessary boustrophedonous movement to the laser during ablation of metal layer 66 including moving membrane 60 while keeping the laser stationary.

The present invention also contemplates exposing to a laser three-dimensional surfaces of a photo-mask, transparent to the UV light, wherein the surfaces are chemically treated for metal adhesion. The laser beam deactivates the surfaces of the photo-mask in desired areas, thereby creating a pattern in accordance with a conductive trace pattern desired on the three-dimensional substrate. A metal is then deposited on the activated areas to form a pattern opaque to the UV light.

The photo-mask of the present invention can be used in photo-imaging the solder masks of a printed circuit board or for simultaneously photo-imaging more than one side of a multi-sided printed circuit board, such as a component and a circuit side.

It will be understood that the foregoing description and drawings are only illustrative of the present invention and it is not intended that the invention be limited thereto. Numerous variations, changes, substitutions, and modifications will now occur to those skilled in the art which come within the scope of the present invention without departing from the spirit and scope thereof. Accordingly, it is intended that the invention be limited only by the scope of the appended claims.

What is claimed is:

1. A method of preparing a photo-mask for exposing selected areas on surfaces of a three-dimensional substrate to light from a light source of a predetermined range of wavelength, said method comprising the steps of:
   supplying an opaque material to form an opaque layer over said surfaces of said substrate such that said layer has a contour on at least one side conforming to said surfaces;
   supplying a membrane material transparent to said light on top of a side of said opaque layer not in contact with said surfaces;
   setting said membrane material into a membrane wherein said membrane adheres to said opaque layer;
   separating said membrane having said opaque layer adhered thereto from said substrate; and
   producing a pattern of grooves transmissive to said light on said opaque layer to form said photo-mask.

2. The method of claim 1 wherein said step of setting comprises vulcanizing said membrane material thereby solidifying it into said membrane.

3. The method of claim 2 wherein said vulcanizing is accelerated by heating said membrane material 4. The method of claim 1 wherein said step of producing said pattern of grooves comprises ablating selected portions of said opaque layer by a laser beam in accordance with a desired pattern on said surfaces of said three-dimensional substrate wherein said laser beam is directed by providing a boustrophedonous motion to a laser or said laser beam.

5. The method of claim 4 wherein said boustrophedonous motion is governed by controlling means.

6. The method of claim 4 wherein said desired pattern provides a dark field pattern suitable for exposing a positive or a negative photoresist layer applied over said surfaces of said three-dimensional substrate.

7. The method of claim 4 wherein said desired pattern provides a light field pattern suitable for exposing a positive or a negative photoresist layer applied over said surfaces of said three-dimensional substrate.

8. A photo-mask produced according to the method of claim 1.

* * * * *